US012604513B2

(12) United States Patent
Kim et al.

(10) Patent No.: US 12,604,513 B2
(45) Date of Patent: Apr. 14, 2026

(54) SEMICONDUCTOR DEVICE

(71) Applicant: DB HiTek Co., Ltd., Seoul (KR)

(72) Inventors: Seung Hyun Kim, Bucheon-si (KR); Hee Bae Lee, Bucheon-si (KR); Jae Yuhn Moon, Bucheon-si (KR); Gyu Hyun Jung, Bucheon-si (KR); Soon Jong Park, Bucheon-si (KR)

(73) Assignee: DB HiTek Co., Ltd., Seoul (KR)

( * ) Notice: Subject to any disclaimer, the term of this patent is extended or adjusted under 35 U.S.C. 154(b) by 393 days.

(21) Appl. No.: 18/521,772

(22) Filed: Nov. 28, 2023

(65) Prior Publication Data

US 2025/0089338 A1 Mar. 13, 2025

(30) Foreign Application Priority Data

Sep. 13, 2023 (KR) ........................ 10-2023-0121764

(51) Int. Cl.
*H10D 64/27* (2025.01)
*H10D 30/66* (2025.01)
(52) U.S. Cl.
CPC ......... *H10D 64/519* (2025.01); *H10D 30/665* (2025.01)
(58) Field of Classification Search
CPC ............................ H10D 64/519; H10D 30/665
See application file for complete search history.

(56) References Cited

U.S. PATENT DOCUMENTS

| | | | | |
|---|---|---|---|---|
| 12,009,419 B2 * | 6/2024 | Han | ..................... | H10D 64/518 |
| 2012/0273875 A1 * | 11/2012 | Yedinak | ............... | H10D 30/668 |
| | | | | 438/270 |
| 2021/0343708 A1 * | 11/2021 | Lichtenwalner | ..... | H10D 64/519 |
| 2022/0223708 A1 * | 7/2022 | Su | ......................... | H10D 62/107 |
| 2022/0271154 A1 * | 8/2022 | Han | ................... | H10D 30/0291 |

* cited by examiner

*Primary Examiner* — Steven M Page
(74) *Attorney, Agent, or Firm* — AEON Law, PLLC; Adam L.K. Philipp; Ki Yong O

(57) ABSTRACT

A semiconductor device is provided. The semiconductor device comprises: a substrate including an active region having an active cell region and a termination region surrounding the active region; a gate bus disposed in the active region to be non-overlapped with the active cell region; a gate electrode extending from the gate bus and disposed in the active cell region; a source region disposed on at least one side of the gate electrode in the active cell region; a gate insulating layer disposed between the gate bus and the substrate and between the gate electrode and the substrate; a gate metal disposed on the gate bus to be connected to the gate bus; and a source metal disposed on the gate electrode to be connected to the source region, wherein the gate bus and the gate electrode are disposed on the same layer.

20 Claims, 3 Drawing Sheets

SEMICONDUCTOR DEVICE

CROSS-REFERENCE TO RELATED APPLICATION

This application is based on and claims priority under 35 U.S.C. § 119 to Korean Patent Application No. 10-2023-0121764, filed on Sep. 13, 2023, in the Korean Intellectual Property Office, the disclosure of which is incorporated by reference herein in its entirety.

BACKGROUND

The present disclosure relates to a semiconductor device.

The description in this section simply provides background information on the present embodiments and does not constitute the related art.

A power semiconductor device is an on/off switching device that causes a current to flow when turned on and blocks a reverse current by withstanding a reverse voltage up to a breakdown voltage when turned off. When designing power semiconductor devices, a breakdown voltage parallel plane (BVPP) related to a breakdown voltage is a theoretical breakdown voltage value, and it is necessary to design a termination region close to a theoretical BVPP.

The termination region of a power semiconductor device may be implemented by doping p-type impurities. Since the breakdown voltage reacts sensitively according to a doping depth and length of the p-type impurities, an appropriate design is required.

Meanwhile, a gate bus may be formed in a termination region where p-type impurities closely related to a breakdown voltage are doped. The gate bus may transmit a gate signal to an active cell. A field insulating layer needs to be formed on a lower portion of the gate bus, and an additional process may be required to form a field insulating layer on only the lower portion of the gate bus.

SUMMARY

An object of the present disclosure is to provide a semiconductor device that may improve reliability of a semiconductor device by disposing a gate bus to be non-overlapped with a termination region.

Also, an object of the present disclosure is to provide a semiconductor device that may not perform an additional process by connecting a gate bus to a gate electrode in an active cell region.

Objects of the present disclosure are not limited to the objects described above, and other objects and advantages of the present disclosure that are not described may be understood by the following description and will be more clearly understood by embodiments of the present disclosure. Also, it will be apparent that the objects and advantages of the present disclosure may be realized by the components indicated in the patent claims and combinations thereof.

In the semiconductor device of the present disclosure, a gate bus is disposed to be non-overlapped with a termination region, and thus, reliability of the semiconductor device may be improved.

Also, in the semiconductor device of the present disclosure, a process of forming a field insulating layer at the bottom of a gate bus may be omitted by connecting a gate bus to a gate electrode in an active cell region, and thus, efficiency of the semiconductor device may be increased.

Also, in the semiconductor device of the present disclosure, an area of a gate electrode may be reduced by connecting a gate bus to a gate electrode in an active cell region, and thus, reliability of the semiconductor device may be improved.

According to some aspects of the disclosure, a semiconductor device comprises: a substrate including an active region having an active cell region and a termination region surrounding the active region; a gate bus disposed in the active region to be non-overlapped with the active cell region; a gate electrode extending from the gate bus and disposed in the active cell region; a source region disposed on at least one side of the gate electrode in the active cell region; a gate insulating layer disposed between the gate bus and the substrate and between the gate electrode and the substrate; a gate metal disposed on the gate bus to be connected to the gate bus; and a source metal disposed on the gate electrode to be connected to the source region, wherein the gate bus and the gate electrode are disposed on the same layer.

According to some aspects, the gate insulating layer is in direct contact with the gate bus.

According to some aspects, a height from an upper surface of the substrate to an upper surface of the gate bus is equal to a height from the upper surface of the substrate to an upper surface of the gate electrode.

According to some aspects, the gate bus is not disposed on the termination region.

According to some aspects, a semiconductor device further comprises: a first insulating layer between the gate electrode and the source metal; and a second insulating layer on the gate metal, wherein the terminal region includes the gate insulating layer on the substrate, the first insulating layer on the gate insulating layer to be in direct contact with the gate insulating layer, and the second insulating layer on the first insulating layer.

According to some aspects, the gate electrode and the gate bus are not disposed in the termination region.

According to some aspects, the gate bus extends in a first direction, and the gate electrode extends in a second direction intersecting the first direction.

According to some aspects of the disclosure, a semiconductor device comprises: a substrate including an active region having an active cell region and a termination region surrounding the active region; a gate signal region included in the active area and non-overlapped with the active cell region; a gate electrode disposed in the active cell region of the substrate; a gate bus disposed in the gate signal region of the substrate and configured to transmit a gate signal to the gate electrode; a gate insulating layer disposed between the gate electrode and the substrate and between the gate bus and the substrate to be in direct contact with the gate bus and the gate electrode; a gate metal disposed on the gate bus to be connected to the gate bus; and a source metal disposed on the gate electrode to be connected to the source region.

According to some aspects, the gate bus and the gate electrode are disposed on the same layer.

According to some aspects, a height from an upper surface of the substrate to an upper surface of the gate bus is equal to a height from the upper surface of the substrate to an upper surface of the gate electrode.

According to some aspects, the gate bus is not disposed on the termination region.

According to some aspects, a semiconductor device further comprises: a first insulating layer between the gate electrode and the source metal; and a second insulating layer on the gate metal, wherein the terminal region includes the gate insulating layer on the substrate, the first insulating layer on the gate insulating layer to be in direct contact with the gate insulating layer, and the second insulating layer on the first insulating layer.

According to some aspects, the gate electrode and the gate bus are not disposed in the termination region.

According to some aspects, the gate bus extends in a first direction, and the gate electrode extends in a second direction intersecting the first direction.

According to some aspects of the disclosure, a semiconductor device comprises: a substrate including an active region having an active cell region and a termination region surrounding the active region; a gate signal region included in the active area and non-overlapped with the active cell region; a gate bus disposed in the gate signal region of the substrate; a gate electrode extending from the gate bus and disposed in the active cell region; a gate insulating layer disposed in the gate signal region, the active cell region, and the termination region of the substrate; a first insulating layer disposed on the gate electrode; and a second insulating layer disposed on the gate bus, wherein a portion of the first insulating layer is disposed in the termination region to be in direct contact with a portion of the gate insulating layer disposed in the termination region, and a portion of the second insulating layer is disposed in the termination region to be in direct contact with a portion of the first insulating layer.

According to some aspects, the gate bus and the gate electrode are disposed on the same layer.

According to some aspects, a height from an upper surface of the substrate to an upper surface of the gate bus is equal to a height from the upper surface of the substrate to an upper surface of the gate electrode.

According to some aspects, the gate electrode and the gate bus are not disposed in the termination region.

According to some aspects, the gate bus extends in a first direction, and the gate electrode extends in a second direction intersecting the first direction.

According to some aspects, the semiconductor device further comprises a gate metal disposed on the gate bus to be connected to the gate bus; and a source metal disposed on the gate electrode to be connected to the source region.

In addition to the above description, detailed effects of the present disclosure are described below while describing details for implementing the present disclosure.

DETAILED DESCRIPTION OF THE EMBODIMENTS

Figure 1:
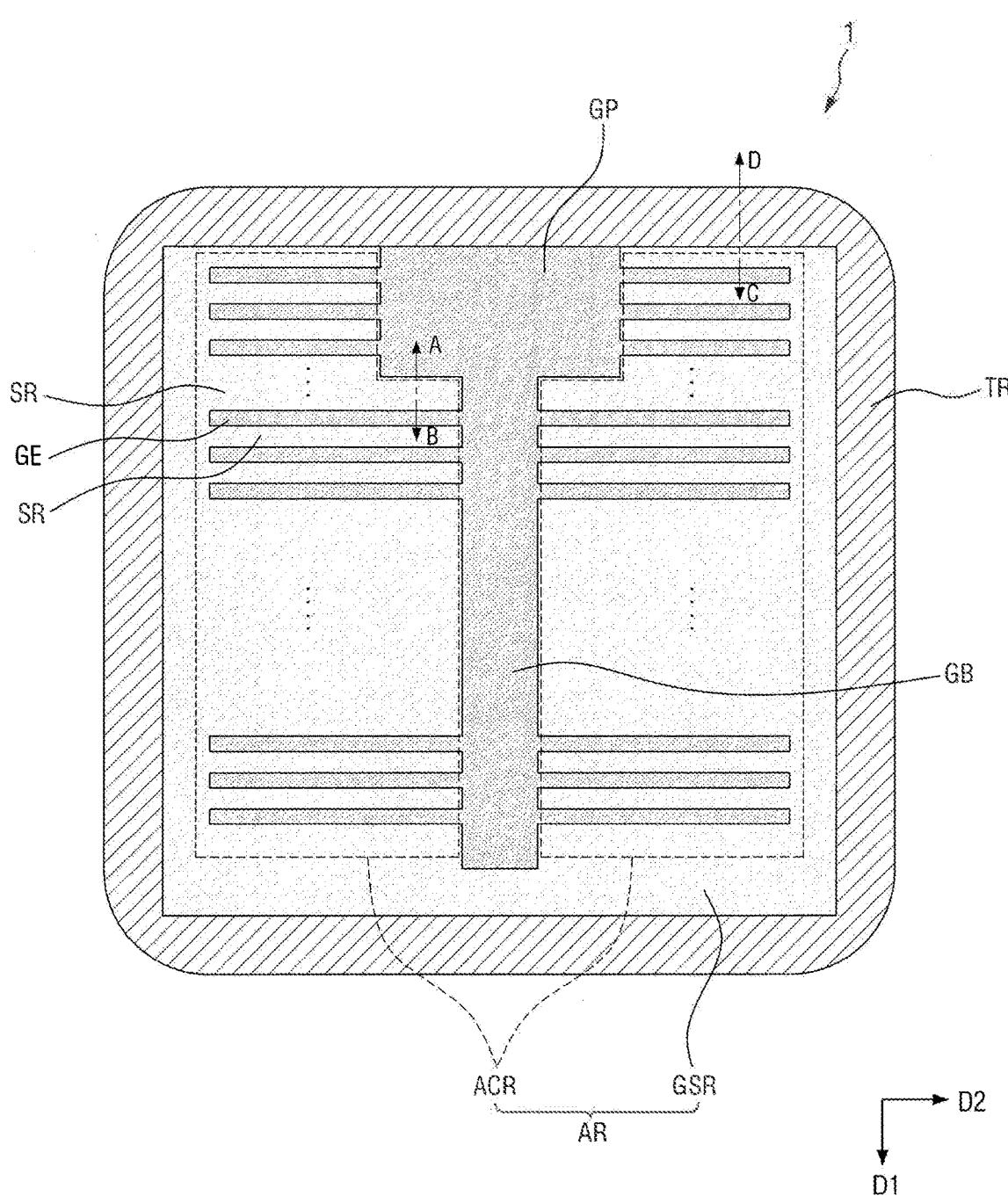
FIG. 1 is a plan view of a semiconductor device according to an embodiment of the present disclosure.

The terms or words used in the disclosure and the claims should not be construed as limited to their ordinary or lexical meanings. They should be construed as the meaning and concept in line with the technical idea of the disclosure based on the principle that the inventor can define the concept of terms or words in order to describe his/her own inventive concept in the best possible way. Further, since the embodiment described herein and the configurations illustrated in the drawings are merely one embodiment in which the disclosure is realized and do not represent all the technical ideas of the disclosure, it should be understood that there may be various equivalents, variations, and applicable examples that can replace them at the time of filing this application.

Although terms such as first, second, A, B, etc. used in the description and the claims may be used to describe various components, the components should not be limited by these terms. These terms are only used to differentiate one component from another. For example, a first component may be referred to as a second component, and similarly, a second component may be referred to as a first component, without departing from the scope of the disclosure. The term 'and/or' includes a combination of a plurality of related listed items or any item of the plurality of related listed items.

The terms used in the description and the claims are merely used to describe particular embodiments and are not intended to limit the disclosure. Singular forms are intended to include plural forms unless the context clearly indicates otherwise. In the application, terms such as "comprise," "comprise," "have," etc. should be understood as not precluding the possibility of existence or addition of features, numbers, steps, operations, components, parts, or combinations thereof described herein.

Unless otherwise defined, the phrases "A, B, or C," "at least one of A, B, or C," or "at least one of A, B, and C" may refer to only A, only B, only C, both A and B, both A and C, both B and C, all of A, B, and C, or any combination thereof.

Unless being defined otherwise, all terms used herein, including technical or scientific terms, have the same meaning as commonly understood by those skilled in the art to which the disclosure pertains.

Terms such as those defined in commonly used dictionaries should be construed as having a meaning consistent with the meaning in the context of the relevant art, and are not to be construed in an ideal or excessively formal sense unless explicitly defined in the application. In addition, each configuration, procedure, process, method, or the like included in each embodiment of the disclosure may be shared to the extent that they are not technically contradictory to each other.

Figure 2:
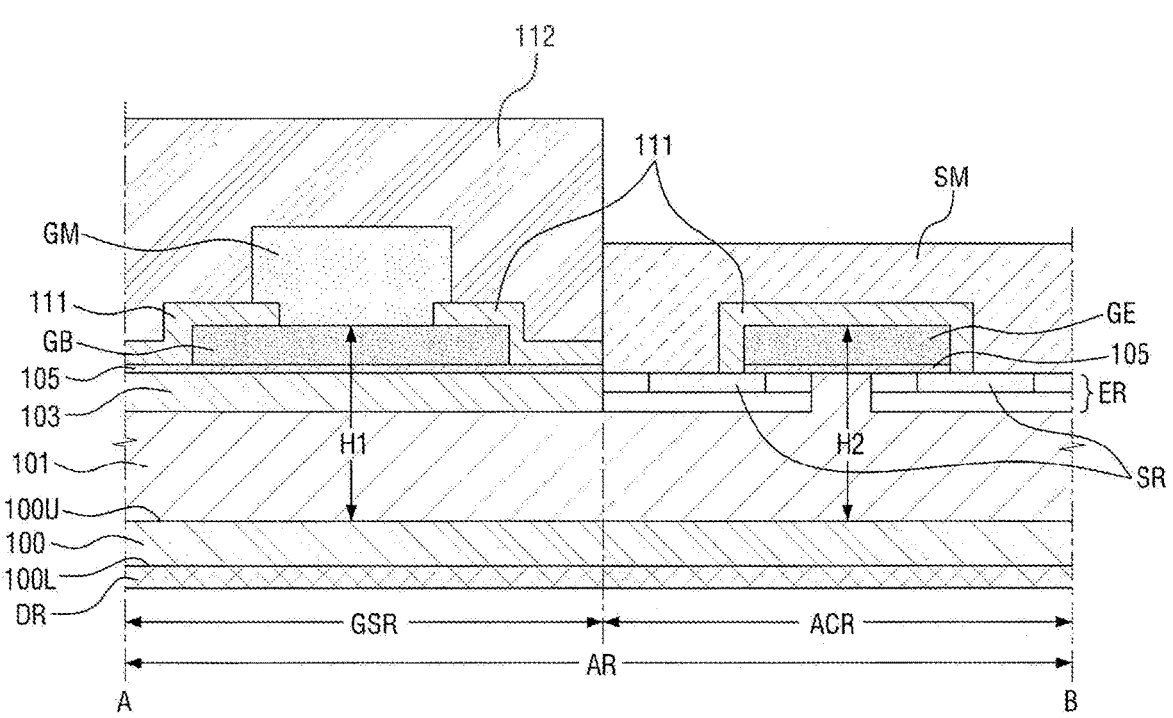
FIG. 2 is a cross-sectional view taken along line A-B of FIG. 1.
Figure 3:
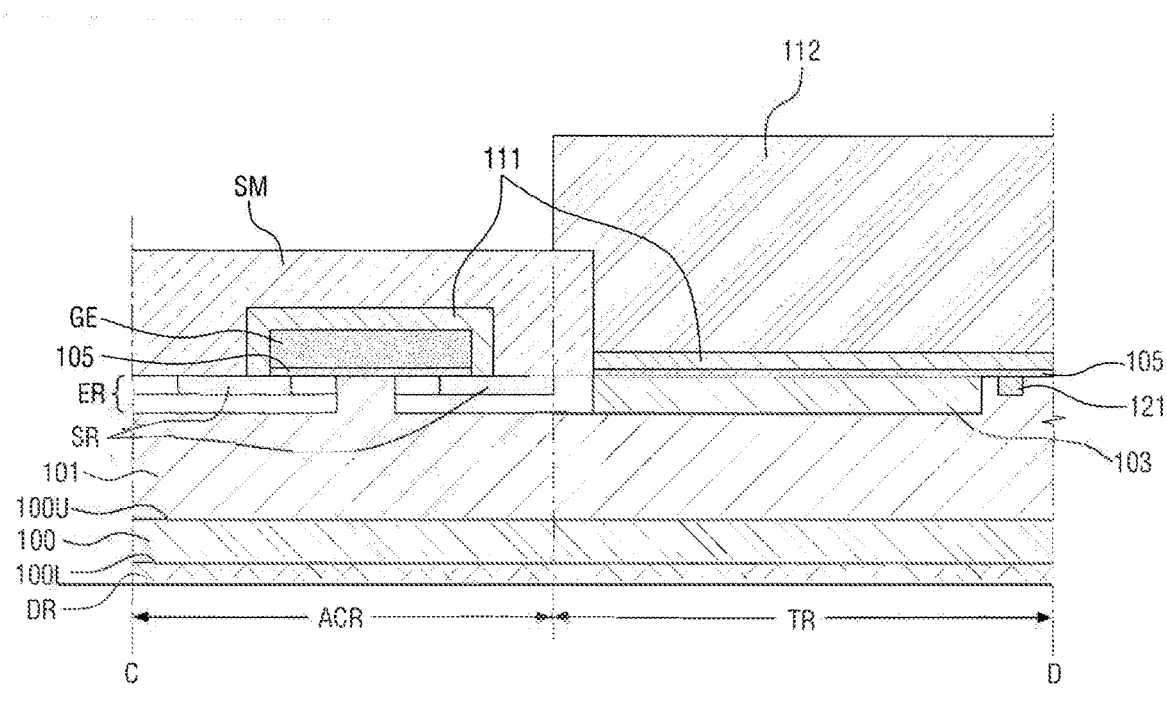
FIG. 3 is a cross-sectional view taken along line C-D in FIG. 1.

FIG. 1 is a plan view of a semiconductor device according to an embodiment of the present disclosure. FIG. 1 does not illustrate a source metal SM, a second insulating layer 112, and so on which will be described below for the sake of clarity of illustration. FIG. 2 is a cross-sectional view taken along line A-B of FIG. 1. FIG. 3 is a cross-sectional view taken along line C-D in FIG. 1.

Referring to FIGS. 1, 2, and 3, a semiconductor device 1 according to an embodiment of the present disclosure includes a substrate 100, a gate bus GB, a gate electrode GE, a source region SR, and a gate pad GP.

The substrate 100 may be, for example, bulk silicon, silicon carbide, or silicon-on-insulator (SOI). Alternatively, the substrate 100 may include another material, such as silicon germanium, indium antimonide, lead telluride, indium arsenide, indium phosphide, gallium arsenide, or gallium antimonide. Alternatively, the substrate 100 may include a base substrate on which an epitaxial layer is formed.

The substrate 100 may include an active region AR and a termination region TR. The active region AR may include an active cell region ACR and a gate signal region GSR.

The active cell region ACR may include at least one transistor.

The gate signal region GSR may be included in the active region AR and may be non-overlapped with the active cell region (ACR).

The termination region TR may surround the active region AR. A region (for example, a $p^+$ region 121) doped with p-type impurities may be disposed in the termination region TR.

The gate bus GB may be disposed in the active region AR to be non-overlapped with the active cell region ACR. The gate bus GB may be disposed in the gate signal region GSR of the substrate 100. The gate bus GB may include the gate pad GP. A wire may be bonded onto the gate pad GP. The gate bus GB may not be disposed in the termination region TR. The gate bus GB may be non-disposed in the termination region TR. A gate signal may be transmitted from the gate bus GB to the gate electrode GE. The gate bus GB may include the same material as the gate electrode GE.

The gate electrode GE may be disposed in the active cell region ACR of the active region AR. The gate electrode GE may not be disposed in the termination region TR. The gate electrode GE may be non-disposed in the termination region TR. The gate electrode GE may include at least one of, for example, TiN, WN, TaN, Ru, TiC, TaC, Ti, Ag, Al, TiAl, TiAlN, TiAlC, TaCN, TaSiN, Mn, Zr, W, and Al. Alternatively, the gate electrode GE may be formed of Si, SiGe, Poly-Si, or so on rather than a metal.

The gate electrode GE may be on the substrate 100 to extend from the gate bus GB. The gate bus GB may be connected to the gate electrode GE. The gate electrode GE may be a portion of the gate bus GB. For example, the gate bus GB and the gate electrode GE may be formed simultaneously during a semiconductor device manufacturing process. Due to this, the gate bus GB and the gate electrode GE may be disposed on the same layer. For example, a height H1 from an upper surface 100U of the substrate 100 to an upper surface of the gate bus GB may be substantially equal to a height H2 from the upper surface 100U of the substrate 100 to an upper surface of the gate electrode GE.

In some embodiments, the gate bus GB may extend on the substrate 100 in a first direction D1. The gate electrode GE may extend from the gate bus GB in a second direction D2. The first direction D1 may intersect the second direction D2.

Although FIG. 1 illustrates that the gate bus GB extends in the first direction D1 to across the substrate 100, the embodiment is not limited thereto. As the gate electrode GE extends from the gate bus GB, the gate bus GB may be connected to the gate electrode GE in the active cell region ACR, and the gate bus GB and the gate electrode GE may be disposed on the same layer, and the gate bus GB and the gate electrode GE may be disposed on the substrate 100 in different shapes.

The source region SR may be disposed on at least one side of the gate electrode GE in the active cell region ACR. The source region SR may not be disposed in the gate signal region GSR and the termination region TR. A drain region DR may be disposed on a lower surface 100L of the substrate 100. The drain region DR may not be disposed in the gate signal region GSR and the termination region TR.

A drift region 101 may be disposed on the upper surface 100U of the substrate 100. The drift region 101 may be doped with, for example, n-type impurities.

A p-well 103 may be disposed on the drift region 101 in the gate signal region GSR. A device partial formation region ER in the active cell region ACR may include the p-well 103. The p-well 103 may be disposed in the drift region 101 of the termination region TR.

The device partial formation region ER in the active cell region ACR may include the source region SR. The device partial formation region ER may be disposed differently from the illustrated shape depending on the type of devices formed in the active cell region ACR.

A gate insulating layer 105 may be disposed over the substrate 100. The gate insulating layer 105 may be disposed in the gate signal region GSR, the active cell region ACR, and the termination region TR. The gate insulating layer 105 may be disposed between the gate bus GB and the substrate 100. The gate insulating layer 105 may be disposed between the gate electrode GE and the substrate 100. The gate insulating layer 105 may be disposed in the termination region TR of the substrate 100.

For example, a portion of the gate insulating layer 105 may be disposed on the drift region 101 of the gate signal region GSR. Another portion of the gate insulating layer 105 may be disposed on the drift region 101 of the active cell region ACR. The other portion of the gate insulating layer 105 may be disposed on the drift region 101 of the termination region TR.

The gate bus GB may be disposed on the gate insulating layer 105 in the gate signal region GSR. The gate bus GB may be in direct contact with the gate insulating layer 105.

The gate electrode GE may be disposed on the gate insulating layer 105 in the active cell region ACR. The gate electrode GE may be in direct contact with the gate insulating layer 105.

A first insulating layer 111 may be disposed on the gate insulating layer 105 in the termination region TR. The first insulating layer 111 may be in direct contact with the gate insulating layer 105.

The semiconductor device according to an embodiment of the present disclosure may not include a field insulating layer between the gate bus GB and the gate insulating layer 105, and thus, a process may be simplified.

The first insulating layer 111 may be disposed in the gate signal region GSR, the active cell region ACR, and the termination region TR.

The first insulating layer 111 in the gate signal region GSR may be disposed on the gate insulating layer 105 and the gate bus GB and may be disposed to expose a portion of the gate bus GB.

The first insulating layer 111 in the active cell region ACR may be disposed on the gate electrode GE. The first insulating layer 111 in the active cell region ACR may be disposed to surround the gate electrode GE. The first insulating layer 111 in the active cell region ACR may be disposed between the gate electrode GE and the source metal SM.

The first insulating layer 111 in the termination region TR may be disposed on the gate insulating layer 105.

The source metal SM may be disposed over the gate electrode GE. The source metal SM may be connected to the source region SR.

In the active cell region ACR, the source metal SM may be disposed on the first insulating layer 111 to be connected to the source region SR. The source metal SM may be disposed in the active cell region ACR and may not be disposed in the gate signal region GSR and the termination region TR.

The gate metal GM may be disposed on the gate bus GB to be connected to the gate bus GB. The gate metal GM) may be connected to a portion of the gate bus GB exposed by the first insulating layer 111. The gate metal GM may be disposed in the gate signal region GSR and may not be disposed in the active cell region ACR and termination region TR.

The second insulating layer 112 may be disposed over the gate bus GB. The second insulating layer 112 may be disposed on the gate metal GM to surround the gate metal GM. The second insulating layer 112 may be disposed in the gate signal region GSR and the termination region TR and may not be disposed in the active cell region ACR.

The second insulating layer 112 in the termination region TR may be disposed on the first insulating layer 111. A portion of the second insulating layer 112 in the termination region TR may be in direct contact with a portion of the first insulating layer 111 in the termination region TR.

The second insulating layer 112 may be, for example, a polyimide layer.

The semiconductor device 1 according to an embodiment of the present disclosure may use a portion of the gate bus GB as the gate electrode GE in the active cell region ACR, and thus, reliability of the semiconductor device 1 may be improved and a process may be simplified. In addition, the semiconductor device 1 according to an embodiment of the present disclosure may use a portion of the gate bus GB as the gate electrode GE in the active cell region ACR to allow the formation of a field insulating layer to be omitted unlike the known field insulating layer that is formed through an additional process, and thus, a process may be simplified.

The foregoing description is merely illustrative of the technical spirit of the embodiment. It will be appreciated by those skilled in the art that various modifications and alterations can be made without departing from the essential characteristics of the embodiment. Therefore, the embodiments of the disclosure have not been described for limiting purposes, and the scope of the spirit of the disclosure is not limited by these embodiments. The protection range of the embodiment should be construed by the claims below, and all technical ideas within an equivalent range thought should be construed as being included within the scope of the embodiment.

What is claimed is:

1. A semiconductor device comprising:
   a substrate including an active region having an active cell region and a termination region surrounding the active region;
   a gate bus disposed in the active region to be non-overlapped with the active cell region;
   a gate electrode extending from the gate bus and disposed in the active cell region;
   a source region disposed on at least one side of the gate electrode in the active cell region;
   a gate insulating layer disposed between the gate bus and the substrate and between the gate electrode and the substrate;
   a gate metal disposed on the gate bus to be connected to the gate bus; and
   a source metal disposed on the gate electrode to be connected to the source region,
   wherein the gate bus and the gate electrode are disposed on the same layer.

2. The semiconductor device of claim 1, wherein the gate insulating layer is in direct contact with the gate bus.

3. The semiconductor device of claim 1, wherein a height from an upper surface of the substrate to an upper surface of the gate bus is equal to a height from the upper surface of the substrate to an upper surface of the gate electrode.

4. The semiconductor device of claim 1, wherein the gate bus is not disposed on the termination region.

5. The semiconductor device of claim 1, further comprising:

a first insulating layer between the gate electrode and the source metal; and
a second insulating layer on the gate metal,
wherein the terminal region includes the gate insulating layer on the substrate, the first insulating layer on the gate insulating layer to be in direct contact with the gate insulating layer, and the second insulating layer on the first insulating layer.

6. The semiconductor device of claim 5, wherein the gate electrode and the gate bus are not disposed in the termination region.

7. The semiconductor device of claim 1, wherein the gate bus extends in a first direction, and the gate electrode extends in a second direction intersecting the first direction.

8. A semiconductor device comprising:
   a substrate including an active region having an active cell region and a termination region surrounding the active region;
   a gate signal region included in the active area and non-overlapped with the active cell region;
   a gate electrode disposed in the active cell region of the substrate;
   a gate bus disposed in the gate signal region of the substrate and configured to transmit a gate signal to the gate electrode;
   a gate insulating layer disposed between the gate electrode and the substrate and between the gate bus and the substrate to be in direct contact with the gate bus and the gate electrode;
   a gate metal disposed on the gate bus to be connected to the gate bus; and
   a source metal disposed on the gate electrode to be connected to the source region.

9. The semiconductor device of claim 8, wherein the gate bus and the gate electrode are disposed on the same layer.

10. The semiconductor device of claim 8, wherein a height from an upper surface of the substrate to an upper surface of the gate bus is equal to a height from the upper surface of the substrate to an upper surface of the gate electrode.

11. The semiconductor device of claim 8, wherein the gate bus is not disposed on the termination region.

12. The semiconductor device of claim 8, further comprising:
   a first insulating layer between the gate electrode and the source metal; and
   a second insulating layer on the gate metal,
   wherein the terminal region includes the gate insulating layer on the substrate, the first insulating layer on the gate insulating layer to be in direct contact with the gate insulating layer, and the second insulating layer on the first insulating layer.

13. The semiconductor device of claim 12, wherein the gate electrode and the gate bus are not disposed in the termination region.

14. The semiconductor device of claim 8, wherein the gate bus extends in a first direction, and the gate electrode extends in a second direction intersecting the first direction.

15. A semiconductor device comprising:
   a substrate including an active region having an active cell region and a termination region surrounding the active region;
   a gate signal region included in the active area and non-overlapped with the active cell region;

a gate bus disposed in the gate signal region of the substrate;

a gate electrode extending from the gate bus and disposed in the active cell region;

a gate insulating layer disposed in the gate signal region, the active cell region, and the termination region of the substrate;

a first insulating layer disposed on the gate electrode; and a second insulating layer disposed on the gate bus, wherein a portion of the first insulating layer is disposed in the termination region to be in direct contact with a portion of the gate insulating layer disposed in the termination region, and a portion of the second insulating layer is disposed in the termination region to be in direct contact with a portion of the first insulating layer.

16. The semiconductor device of claim 15, wherein the gate bus and the gate electrode are disposed on the same layer.

17. The semiconductor device of claim 15, wherein a height from an upper surface of the substrate to an upper surface of the gate bus is equal to a height from the upper surface of the substrate to an upper surface of the gate electrode.

18. The semiconductor device of claim 15, the gate electrode and the gate bus are not disposed in the termination region.

19. The semiconductor device of claim 15, wherein the gate bus extends in a first direction, and the gate electrode extends in a second direction intersecting the first direction.

20. The semiconductor device of claim 15, further comprising:

a gate metal disposed on the gate bus to be connected to the gate bus; and a source metal disposed on the gate electrode to be connected to the source region.

\* \* \* \* \*